US010699909B2

(12) United States Patent
Sonoda et al.

(10) Patent No.: US 10,699,909 B2
(45) Date of Patent: Jun. 30, 2020

(54) PLASMA PROCESSING APPARATUS AND PLASMA PROCESSING METHOD

(71) Applicant: HITACHI HIGH-TECH CORPORATION, Minato-ku, Tokyo (JP)

(72) Inventors: Yasushi Sonoda, Tokyo (JP); Motohiro Tanaka, Tokyo (JP)

(73) Assignee: HITACH HIGH-TECH CORPORATION, Tokyo (JP)

( * ) Notice: Subject to any disclaimer, the term of this patent is extended or adjusted under 35 U.S.C. 154(b) by 729 days.

(21) Appl. No.: 14/625,931

(22) Filed: Feb. 19, 2015

(65) Prior Publication Data
US 2016/0133530 A1 May 12, 2016

(30) Foreign Application Priority Data
Nov. 11, 2014 (JP) .................................. 2014-228527

(51) Int. Cl.
| H01J 37/32 | (2006.01) |
| H01L 21/308 | (2006.01) |
| H01L 21/3065 | (2006.01) |

(52) U.S. Cl.
CPC ...... *H01L 21/308* (2013.01); *H01J 37/32091* (2013.01); *H01J 37/3299* (2013.01);
(Continued)

(58) Field of Classification Search
USPC .......................... 156/345.24–345.28, 345.42, 156/345.43–345.48; 118/723 E, 723 I,
(Continued)

(56) References Cited

U.S. PATENT DOCUMENTS

| 4,949,670 A * | 8/1990 | Krogh ................. H01J 37/3244 118/692 |
| 4,985,114 A * | 1/1991 | Okudaira .......... H01L 21/30655 204/192.3 |

(Continued)

FOREIGN PATENT DOCUMENTS

| JP | 60-50923 A | 3/1985 |
| JP | 2-105413 A | 4/1990 |

(Continued)

OTHER PUBLICATIONS

Office Action dated Jan. 20, 2016 for corresponding Korean Application No. 10-2015-0016544.

*Primary Examiner* — Rakesh K Dhingra
(74) *Attorney, Agent, or Firm* — Miles & Stockbridge, P.C.

(57) ABSTRACT

A plasma processing apparatus includes a processing chamber configured to perform a plasma processing on a sample, a first radio frequency power supply configured to generate a plasma, a sample stage configured to place the sample thereon, a second radio frequency power supply configured to supply a radio frequency power to the sample stage, a mass flow controller configured to supply a gas into the processing chamber, and a control device configured to change the radio frequency power supplied from the first radio frequency power supply or the second radio frequency power supply based on a change of plasma impedance after a first gas is switched to a second gas.

6 Claims, 8 Drawing Sheets

(52) U.S. Cl.
CPC .. *H01J 37/32183* (2013.01); *H01J 37/32192* (2013.01); *H01J 37/32311* (2013.01); *H01J 37/32449* (2013.01); *H01L 21/3065* (2013.01)

(58) Field of Classification Search
USPC .................................................. 118/723 MW
See application file for complete search history.

(56) References Cited

U.S. PATENT DOCUMENTS

| | | | | |
|---|---|---|---|---|
| 5,688,357 | A * | 11/1997 | Hanawa | H01J 37/32082 156/345.28 |
| 6,265,831 | B1 * | 7/2001 | Howald | H01J 37/32082 118/723 AN |
| 2005/0241763 | A1 | 11/2005 | Huang et al. | |
| 2006/0220574 | A1 * | 10/2006 | Ogawa | H01J 37/32082 315/111.21 |
| 2007/0066038 | A1 | 3/2007 | Sadjadi et al. | |
| 2007/0116887 | A1 | 5/2007 | Faguet | |
| 2007/0181254 | A1 * | 8/2007 | Iida | H01J 37/32082 156/345.28 |
| 2010/0258529 | A1 * | 10/2010 | Mori | H01J 37/32091 216/67 |
| 2011/0234100 | A1 * | 9/2011 | Tomita | H01J 37/32091 315/111.21 |
| 2011/0281435 | A1 | 11/2011 | Sadjadi et al. | |
| 2012/0038277 | A1 * | 2/2012 | Eto | H01J 37/32091 315/111.21 |
| 2014/0203821 | A1 * | 7/2014 | Yamamoto | H01J 37/32917 324/654 |
| 2014/0231389 | A1 * | 8/2014 | Nagami | H01J 37/32091 216/67 |

FOREIGN PATENT DOCUMENTS

| | | |
|---|---|---|
| JP | 2009521594 A | 6/2009 |
| KR | 20090082493 A | 7/2009 |
| WO | 2007061633 A2 | 5/2007 |
| WO | 2008061069 A1 | 5/2008 |

* cited by examiner

PLASMA PROCESSING APPARATUS AND PLASMA PROCESSING METHOD

BACKGROUND OF THE INVENTION

The present invention relates to a plasma processing apparatus and a plasma processing method and, particularly, to a plasma processing apparatus and a plasma processing method in which surface processing of a semiconductor substrate or the like is performed while gases are periodically switched during plasma processing.

Due to miniaturization in a recent semiconductor technology, higher shape controllability is demanded for etching processing in which a mask shape is transferred onto an underlying film. Various etching methods of a vertical shape having a high aspect ratio are known, and among them, there is known a gas chopping method, in which an etching gas and a deposition gas that forms a protective film having high etching resistance against the etching gas are alternately introduced into a processing chamber in a cyclic manner while a plasma is kept being generated so that plasma etching processing is performed as a whole.

For example, JP-A-S60-050923 discloses a technology in which radio frequency (RF) power supplied to a sample stage is also changed in synchronization with gas introduction to generate different self-biases in a process of introducing the etching gas and a process of introducing the deposition gas for the purpose of enhancing effects of the respective gases when the gases are alternately introduced.

When etching processing is performed while alternately performing the etching and the protective film formation using the gas chopping method, an unpreferable shape of fine steps called "scalloping" is formed on aside surface of an etched hole after etching. In order to mitigate the fine-step shape, it is effective that respective times of introduction of the alternately-introduced gases are shortened down to 1 to 3 seconds.

Control of an amount of gas introduced into the processing chamber is typically conducted by providing a control signal to a mass flow controller (MFC) which makes the gas flow at a desired gas flow rate. However, a delay of about 1 second occurs until the gas is introduced into the processing chamber after the signal of a flow rate is provided to the mass flow controller due to the influences of a response time of the mass flow controller, gas piping or a shower plate, a pressure and a gas flow in the processing chamber, and the like; in addition, the delay varies by about 0.2 to 0.3 seconds.

Therefore, when the introduction time period of a gas is set to about 1 to 3 seconds, deviations in time between a duration when a process gas for etching or protective film formation is introduced in the processing chamber and a duration when process parameters such as a bias and power for generating plasma are controlled to values suitable for respective processings become innegligible and optimized processings can not be realized if control is not performed in consideration of the delay from providing a control signal to a mass flow controller until the gas is actually introduced into the processing chamber.

Furthermore, in order to reduce influences of variations in the delay time of the gas introduction, other process parameters may necessarily be controlled while monitoring an exact time of the gas introduction into the processing chamber in real time. As a method of determining exchange of the etching gas and the deposition gas, a method such as that disclosed in JP-A-H02-105413 is known, in which the timing point of replacement of the etching gas and the deposition gas is obtained by detecting a gas ratio using an emission spectrum or a mass spectrometer and radio frequency power is synchronized with it.

SUMMARY OF THE INVENTION

However, the technology of the related art described above fails to have a sufficient consideration on the following points. In the method disclosed in JP-A-H02-105413, since replacement of the gases is determined based on the emission from the plasma, a window used for observing emission due to etching and/or emission from the plasma in the processing chamber may be subject to degradation of its surface while being exposed to etching atmosphere, or reduction in transmissivity due to attachment of reaction products or the like, so that accuracy in determination of replacement of the gases is lowered.

In addition, when a mass spectrometer is used, it is desirable that it be provided away from a processing chamber in order not to disturb etching processing, that is, for example, in a vicinity of a vacuum exhaust device downstream of the processing chamber; however, analysis on the gas composition in the processing chamber will be delayed in proportion to separation from the processing chamber and, when an introduction cycle of a gas is short, the composition analysis of the gas in the processing chamber may not be able to keep up with the introduction cycle of the gas.

The present invention has been made in view of the above problems, and an object is to provide a plasma processing apparatus performing plasma processings while periodically switching gases in which plasma etching of good stability and high shape controllability can be performed.

According to the present invention, there is provided a plasma processing apparatus which includes: a processing chamber configured to perform plasma processing on a sample; a first radio frequency power supply configured to supply radio frequency power to generate a plasma in the processing chamber; a sample stage configured to place the sample thereon; a second radio frequency power supply configured to supply radio frequency power to the sample stage; a mass flow controller configured to supply a gas into the processing chamber; and a control device configured to control the first radio frequency power supply or the second radio frequency power supply to change the radio frequency power supplied from the first radio frequency power supply or the radio frequency power supplied from the second radio frequency power supply based on a change of plasma impedance after a first gas is switched to a second gas.

In addition, according to the present invention, there is provided a plasma processing method which performs plasma processing on a sample while periodically switching between a first gas and a second gas, including the steps of: detecting a change of plasma impedance after switching from the first gas to the second gas; and changing a radio frequency power supplied to a sample stage on which the sample is placed or a radio frequency power for generating a plasma after detecting the change of the plasma impedance.

According to the present invention, it is possible to provide a plasma processing apparatus performing plasma processings while periodically switching gases in which plasma etching of good stability and high shape controllability can be performed.

Other objects, features, and advantages of the invention will become apparent from the following description of the embodiments of the invention taken in conjunction with the accompanying drawings.

DESCRIPTION OF THE EMBODIMENTS

Hereinafter, embodiments of the invention will be described with reference to the drawings.

In the present invention, when etching processing is performed on a semiconductor substrate while alternately introducing an etching gas and a deposition gas to a processing chamber, introduction of each gas to the processing chamber is detected with a change in plasma impedance which accompanies switching between the etching gas and the deposition gas, and process parameters other than gas conditions such as the radio frequency power for generating a self-bias are changed in synchronization with it. Hereinafter, the present invention is further described.

Figure 1:
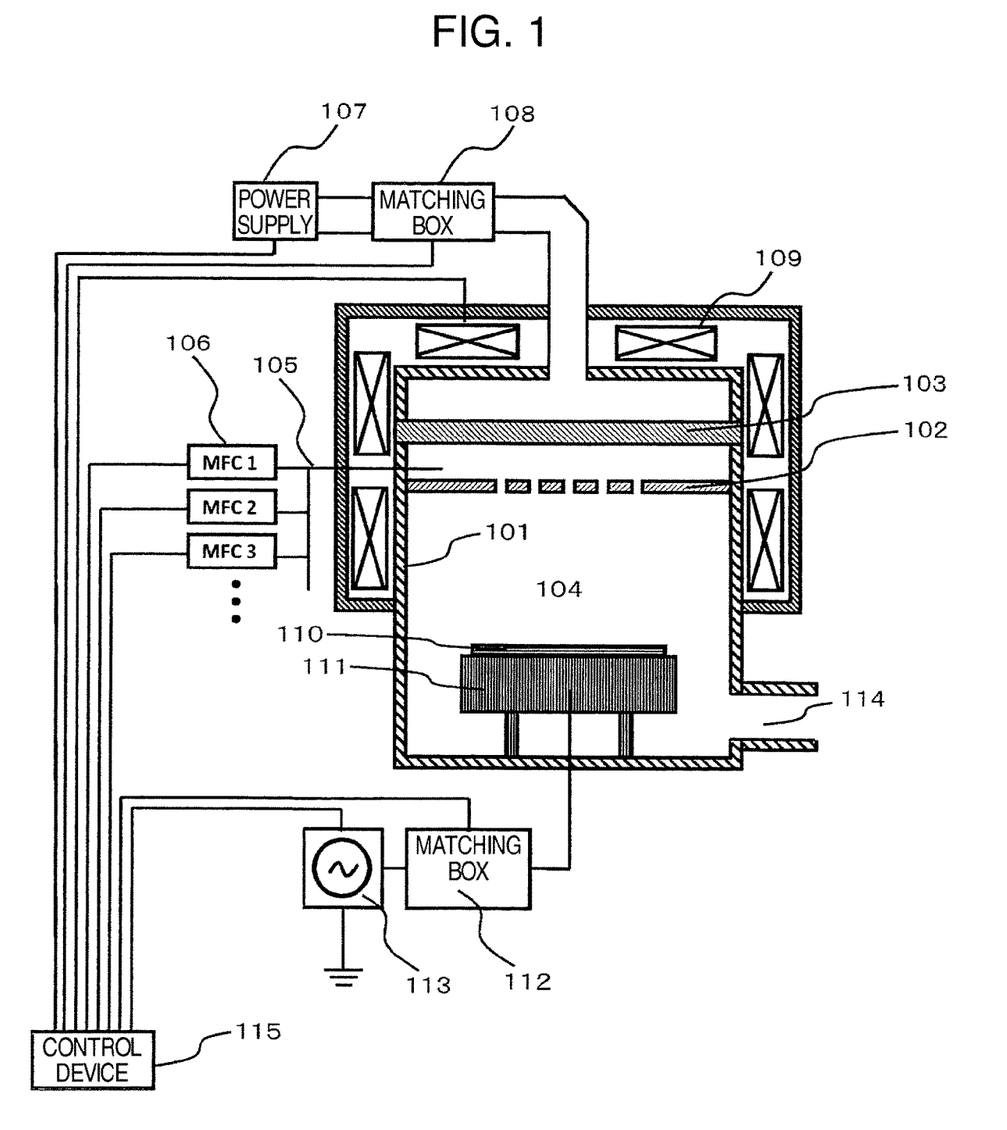
FIG. 1 shows a vertical cross-sectional view illustrating a configuration of a plasma processing apparatus according to the present invention.

FIG. 1 shows a vertical cross-sectional view schematically illustrating the entire configuration of a plasma processing apparatus according to the present embodiment. A processing chamber 104 is constructed such that a shower plate 102 which introduces an etching gas into a vacuum chamber 101 and a dielectric window 103 which is to air-tightly seal the upper portion of the processing chamber are disposed on the upper portion of the vacuum chamber 101. On the upstream side of the shower plate 102, a plurality of mass flow controllers (MFC's) 106 are connected via gas piping 105, and process gases (not illustrated) such as an $SF_6$ gas or an $O_2$ gas for performing plasma etching processing are supplied respectively to the mass flow controllers 106.

It is assumed that with the above plurality of mass flow controllers a first process gas (the etching gas) for performing etching processing and a second process gas (the deposition gas) for performing a protective film forming processing can be alternately introduced to the processing chamber 104 through the bogus piping 105 and the shower plate 102 in a constant cycle. Incidentally, the etching gas and the deposition gas may be a single-composition gas or may be composed of a plurality of gases. In addition, in order to reduce unstableness of discharge at the time of switching gases, a noble gas may be added in the etching gas and the deposition gas as a common gas which does not cause a large change in property of each processing such as an Ar gas or a He gas. Moreover, a vacuum exhaust device (not illustrated) is connected to the vacuum chamber 101 through a vacuum exhaust port 114, and a pressure in the processing chamber 104 can be controlled.

A mechanism of generating a plasma with this plasma processing apparatus is configured with a power supply for generating an electromagnetic wave (magnetron) 107 which generates an electromagnetic wave (a microwave) of 2.45 GHz, a microwave matching box 108, and a magnetic field generating coil 109; a plasma is generated in the processing chamber 104 by an electron cyclotron resonance (ECR) between the electromagnetic wave oscillated from the power supply for generating the electromagnetic wave 107 serving as a first radio frequency power supply and the magnetic field formed by the magnetic field generating coil 109.

In addition, a sample stage 111 on which a semiconductor substrate 110 as a sample is mounted is arranged in the lower portion of the processing chamber 104 facing the shower plate. A second radio frequency power supply 113 is connected to the sample stage 111 via a radio frequency matching box 112. By supplying a radio frequency power from the radio frequency power supply 113 connected to the sample stage 111, a negative voltage is normally generated on the sample stage III, which is called a self-bias; ions in the plasma are accelerated by the self-bias and vertically enter the semiconductor substrate 110, so that the semiconductor substrate 110 is etched.

A control device 115 controls the above-mentioned devices based on process conditions. Also, the control device 115 acquires data from a sensor at the matching box according to a method described below to detect gas introduction into the processing chamber, and controls timings when process parameters other than the gas conditions are changed after the detection.

When the process parameters are kept constant, plasma impedance would not change so much. However, in a case where the gas in the processing chamber 104 is replaced while the plasma is generated like the gas chopping method, electron densities and electron temperatures, which are fundamental variables of a plasma, change since dissociation or ionization varies depending on the gas species. With this change, the plasma impedance also changes according to the replacement of the gas. The present invention utilizes this phenomenon; based on a change in plasma impedance, gas replacement in the processing chamber in the gas chopping method is detected and, after the replacement of the gases is detected, the process parameters are changed to be those suitable for each of the etching processing and the protective film forming processing.

As it is widely known, the radio frequency matching box 112 and the microwave matching box 108 serve to reduce a reflected wave by respectively matching an impedance of the radio frequency power supply 113 or the power supply for generating an electromagnetic wave 107 with an impedance of a circuit including the plasma impedance viewed from each power supply, and efficiently supply power to a plasma, which is a load.

Therefore, a change of the plasma impedance can be detected with a plurality of sensors in the radio frequency matching box 112 and the microwave matching box 108. Examples of detectable parameters include a peak-to-peak voltage Vpp of the radio frequency power and a reflected wave power.

In other words, the peak-to-peak voltage (Vpp) of the radio frequency power changes along with a change of the plasma impedance when control is made to keep the radio frequency power constant. Also, since, when the plasma impedance changes, a matching point changes and it becomes mismatched instantaneously, it can be observed as generation of a reflected wave. Hereinafter, an example of determination on the replacement of the gases in the processing chamber using these phenomena will be described.

Figure 2:
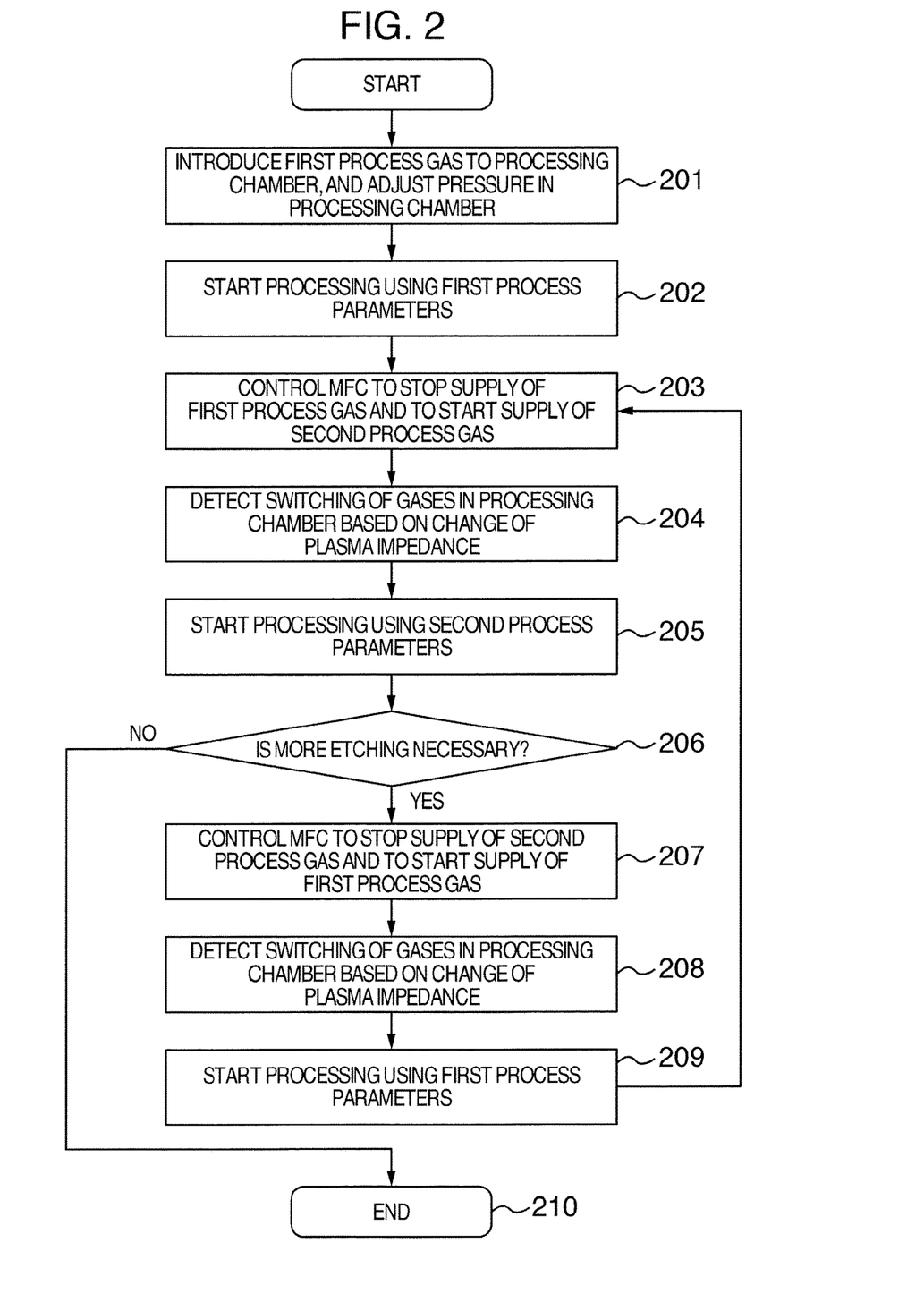
FIG. 2 shows a flowchart illustrating control according to the present invention.

FIG. 2 shows a flowchart illustrating a control method of the mass flow controller and the radio frequency power supply 113. First, in Step 201, a first process gas is introduced into the processing chamber 104 by transmitting a control signal to the mass flow controllers and control is made to achieve a target process pressure. In Step 202, the plasma is generated by generating a magnetic field while supplying a microwave for plasma generation to the processing chamber and, then, the etching processing starts by controlling the respective portions of the apparatus to operate at first process parameters such as supplying RF power to the sample stage to generate the self-bias.

In Step 201 and Step 202 of starting the plasma etching processing, control on other process parameters such as generation of the plasma and supply of the radio frequency power from the radio frequency power supply 113 may be performed after the first process gas is sufficiently introduced and a pressure in the processing chamber becomes suitable for processing, and a delay of gas introduction or a switching of the gases may not be needed to be detected.

Figure 3:
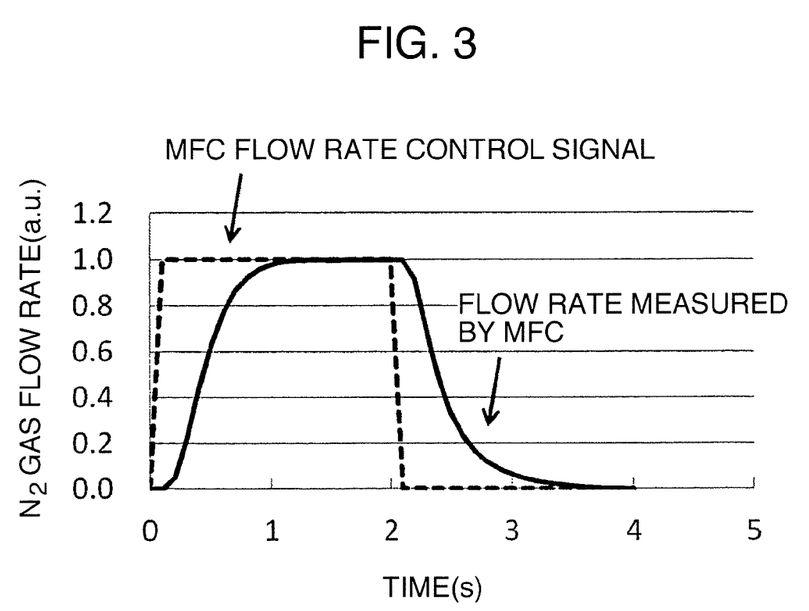
FIG. 3 shows a graph illustrating a gas flow rate which is supplied from a mass flow controller when a flow control signal is transmitted to the mass flow controller.

Next, in Step 203, after a time period of a first processing elapses, which was set in advance, a control signal is transmitted to the mass flow controllers 106 to stop the supply of the first process gas and to make the supply of the second process gas start. FIG. 3 illustrates a gas supply flow rate which is measured by a mass flow controller in response to the control signal which is transmitted to the mass flow controller.

A time period of about 0.2 seconds passes before the gas starts to flow after the control signal is transmitted, and a time period of about 0.6 seconds passes further after the gas starts to flow before the flow rate rises up to 90% or more of a target value. Until the gas reaches the processing chamber after the control signal is transmitted to the mass flow controller, since it passes through the gas piping and the shower plate, a further delay arises.

Figure 4:
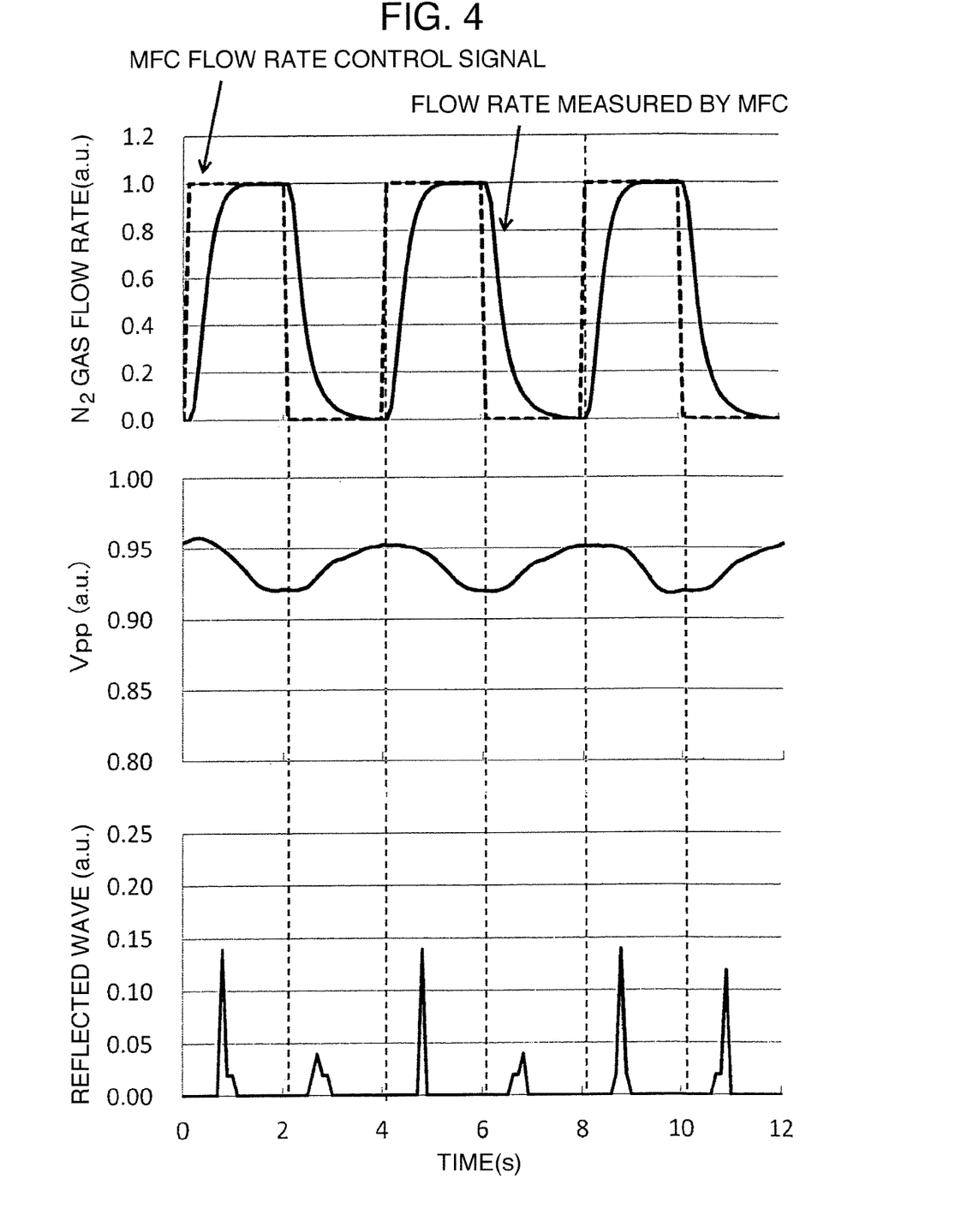
FIG. 4 shows a diagram illustrating Vpp and a reflected wave in a case where an $N_2$ gas is supplied to a processing chamber for 2 seconds in a pulse and the supply is cut off for 2 seconds repeatedly.

Next, in Step 204, when the supply of the first process gas is stopped and the second process gas begins to be introduced to the processing chamber, the plasma impedance starts to change, and it is detected at the radio frequency matching box as a change of Vpp or generation of the reflected wave of a radio frequency bias power. FIG. 4 shows a diagram illustrating Vpp and the reflected wave in a case where an $N_2$ gas is supplied to the processing chamber for 2 seconds in a pulse and the supply is shut off for 2 seconds repeatedly while a plasma of a mixed gas of an Ar gas and an $N_2$ gas is generated.

In the present embodiment, since process parameters other than the gases are changed after supplying the etching gas and the deposition gas while being periodically switched alternately and detecting the switching over of the gases in the processing chamber, a large change of Vpp or the like due to changes of the process parameters other than the gases is added after the change due to the switching of the gas. Incidentally, in FIG. 4 a result obtained in a case where the periodically-controlled process parameters are limited only to the $N_2$ gas and the other process parameters are kept constant regardless of the change of the flow rate of the $N_2$ gas is illustrated in order to investigate only a time relation between the control signal transmitted to the mass flow controller and the change of Vpp or the like.

When the flow rate of the $N_2$ gas is changed, Vpp starts to change with a delay relative to a flow control signal, and a time period of about 1.5 seconds is taken until it is stabilized. In addition, the reflected wave is generated at the time when Vpp starts to change. These changes are considered as follows.

After the flow control signal is changed to make the gas start to be supplied in the beginning, the gas starts to be introduced to the processing chamber with a delay of about 0.8 seconds. Since a composition of the gas flowing in the processing chamber significantly changes at the start of the introduction, the electron density of the plasma significantly changes along with it. When the electron density changes significantly, the plasma impedance also significantly changes; therefore, not only the matching point deviates and the reflected wave is generated, also Vpp starts to change.

After the reflected wave is generated, automatic re-matching is performed by the matching box, and the change in the amount of introduced gas becomes slow, so that the reflected wave becomes 0. On the other hand, Vpp starts to change in accordance with the start of the gas flow rate, and it is considered that the electron density together with the impedance keeps changing until the gas flow rate is stabilized after a time period of about 0.7 seconds further passes. Incidentally, it is possible to investigate a degree of variation in time period taken until the gas is introduced into the processing chamber with the change of Vpp.

Figure 5:
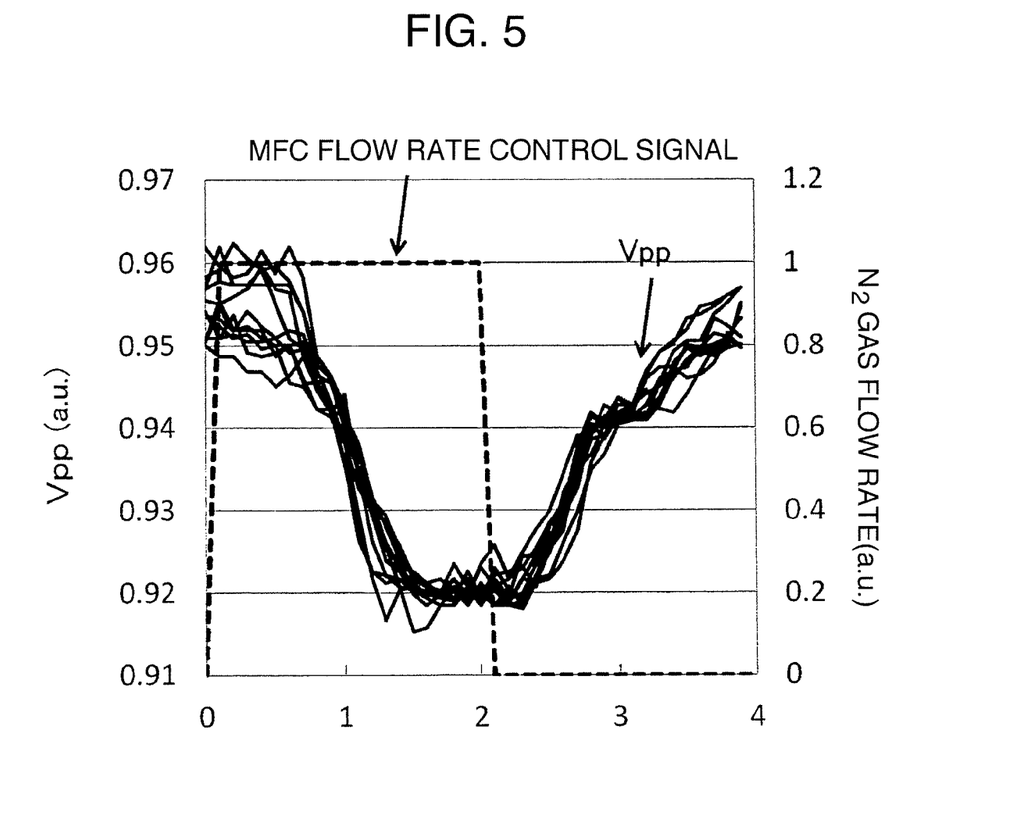
FIG. 5 shows a graph illustrating response of Vpp when the pulse of the $N_2$ gas by a control signal of the mass flow controller is repeatedly introduced to the processing chamber 10 times.

FIG. 5 shows a graph illustrating how Vpp responses when a pulse of the $N_2$ gas by a control signal of the mass flow controller is repeatedly introduced to the processing chamber 10 times. The broken line indicates the control signal transmitted to the mass flow controller, and the solid line indicates Vpp when the pulse is repeated 10 times. Referring to FIG. 5, it can be seen that there is a variation of 0.3 seconds at the falling edge and the rising edge of Vpp. Since this variation makes up a deviation of 10 percent or more in the introduction time period of the gas, it is important that the gas introduction to the processing chamber is detected in Step 204 including the variation.

Figure 6:
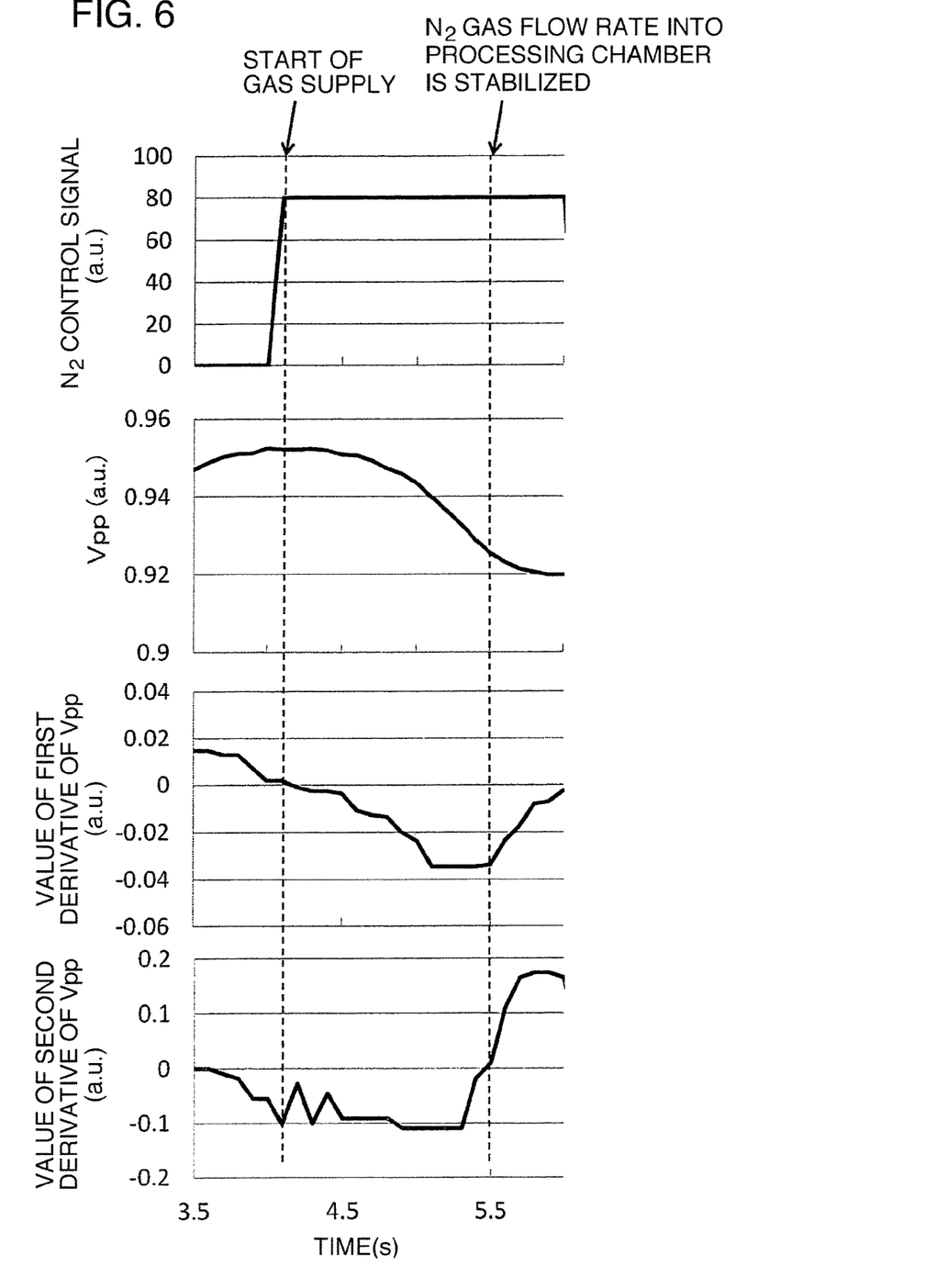
FIG. 6 shows a diagram illustrating Vpp and first and second derivatives of Vpp with respect to a change of the flow control signal of the $N_2$ gas.

As a method of detecting the gas introduction using Vpp, a first derivative of Vpp is calculated and, when a value of the first derivative becomes equal to or more than a predetermined threshold, it is detected that the gas is introduced into the processing chamber and switched over. Alternatively, a second derivative of Vpp is calculated, and the detection may be performed at a timing point where a value of the second derivative crosses over "0". FIG. 6 shows a diagram illustrating Vpp and the first and second derivatives of Vpp with respect to a change of the flow control signal of the $N_2$ gas.

When the $N_2$ gas is supplied, Vpp decreases to cause the first derivative value to become negative. In the case of FIG. 6, the introduction of the gas can be detected by calculating the first derivative value after the start of the gas supply and setting the threshold to about −0.02. In addition, the second derivative value increases from negative to positive and crosses over "0" 1.4 seconds later after a signal for the start of the gas supply is transmitted, since this time period represents a timing point where the change of Vpp becomes slow, it can be detected as the time period where an $N_2$ gas flow rate in the processing chamber starts to be stabilized. In addition, in a case where the introduction of the gas into the processing chamber is to be detected using the reflected wave, it would be appropriate that a threshold is set and the start of the gas introduction is detected as a timing point where the reflected wave equal to or more than a certain value is generated in or after Step 203.

After the switching from the first process gas to the second process gas is detected, the process parameters are changed and the protective film forming processing starts in Step 205. Next, in Step 206, after the time period of the second processing set in Step 203 elapses, it is determined whether the etching is performed to a target depth. In a case where the etching is performed to the target depth and thus no further etching is required, the processing ends in Step 210. In a case where the etching does not proceed to the target depth, the etching processing and the protective film forming processing are repeatedly performed again until the etching is performed to the target depth.

In the present invention, there are two time periods: a time period in which the control signals are transmitted to make respective process gases supplied, and a time period in which the process gases are introduced to the processing chamber and other process parameters are controlled to be values suitable for the respective processes. As the time period of the second processing set in Step 206, a time period in which the control signals for supplying the gases are transmitted would be preferably used. In a case where a desired etching depth is achieved after a time period of gas supply, which is set in advance, elapses, the supplies of the microwave and the like are stopped and the processing is terminated. Besides, in a case where the etching does not proceed to the target depth, the process parameters other than the gases are continuously controlled to be values of the second process parameters.

The switching from the protective film forming processing to the etching processing is performed in the same sequence as Steps 203 to 205. First, in Step 207, the control signal is transmitted to the mass flow controllers 106 in order to stop the supply of the second process gas and to make the supply of the first process gas start. Next, in Step 208, the switching of the gases in the processing chamber from the second process gas to the first process gas is determined by detecting the change of the plasma impedance.

Subsequently, after the switching from the second process gas to the first process gas is detected, the process parameters are changed to make the etching processing start, in Step 209. Next, after the time period set in Step 208 for the first process elapses, the procedure returns to Step 204 and the protective film forming processing is performed again. In this way, Steps 207 to 209 and Steps 203 to 205 are repeatedly performed until the target etching depth is achieved.

The gas introduction to the processing chamber is detected whenever the supplies of the process gases are changed, but the detection of the gas introduction may be failed due to noises or the like in actual processings. With regard to this concern, a threshold may be set to a time period from the start of the supply of the process gas until the detection of the introduction of the gas to the processing chamber and, in a case where a change of the plasma impedance can not be detected in this time period, the process parameters other than the gases may be changed at the moment when the threshold time period elapses from the supply of the process gas.

In addition, as for setting of the threshold time period, it is effective that a time period from transmission of a control signal to an MFC for supplying each process gas until the introduction into the processing chamber is measured plural times in advance using the change of the plasma impedance and the longest time period until the introduction among the measurements is used to be set. Next, the description will be made on an example in which the gas introduction is detected from the second derivative of Vpp and the radio frequency power supplied from the radio frequency power supply 113, which is one of the process parameters, is changed accordingly.

When the gas introduction is detected from the second derivative of Vpp, it should be investigated how Vpp changes at the time when the etching gas and the deposition gas are introduced to the processing chamber, whether the cross-over of the second derivative value with "0" occurs in the direction of from positive to negative or in the direction of from negative to positive, and the like on condition that the radio frequency power from the radio frequency power supply 113 is set to be constant.

Figure 7:
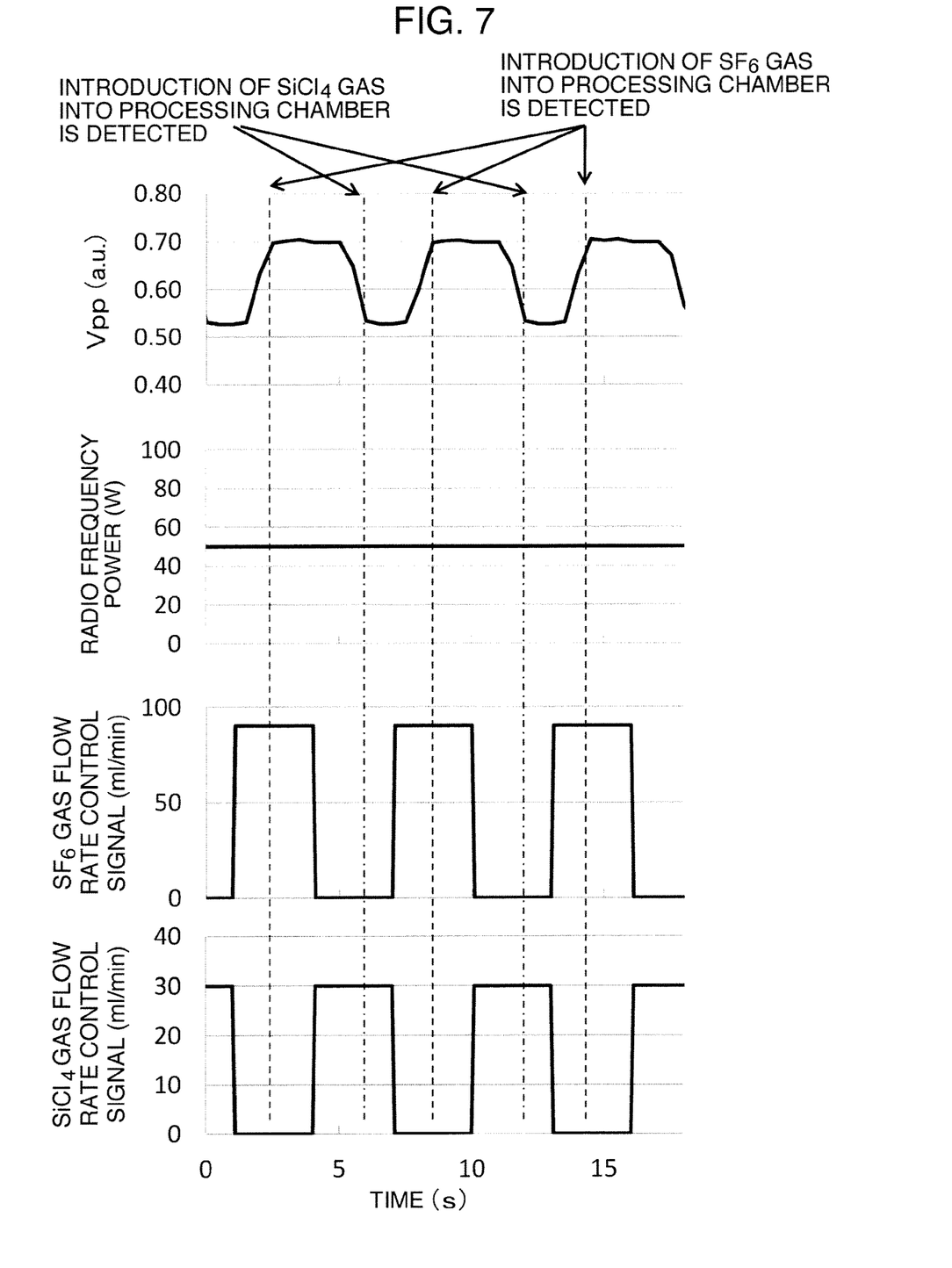
FIG. 7 shows a diagram illustrating changes of Vpp when an $SF_6$ gas and an $SiCl_4$ gas are alternately introduced to the processing chamber.

Next, FIG. 7 illustrates the change of Vpp when an $SF_6$ gas as a component of the etching gas and an $SiCl_4$ gas as a component of the deposition gas are alternately introduced to the processing chamber where the $O_2$ gas and the Ar gas are also used as common gas components of the etching gas and the deposition gas. The conditions of the etching gas are set so that flow rates of the $SF_6$ gas, the $O_2$ gas, and the Ar gas are 90 ml/min, 10 ml/min, and 50 ml/min, respectively, and the conditions of the deposition gas are set so that flow rates of the $SiCl_4$ gas, the $O_2$ gas, and the Ar are 30 ml/min, 10 ml/min, and 50 ml/min, respectively; the introduction time period of each gas is set to 3 seconds and the gases are introduced to the processing chamber repeatedly. In addition, a microwave power of 600 W, a process pressure of 0.3 Pa, and the radio frequency power of the radio frequency power supply 113 of 30 W are set to be constant.

The timing points at which the switching of the gases in the processing chamber are detected using the second derivative from the result of FIG. 7 are when it crosses over "0" from positive to negative in a case where the $SF_6$ gas is introduced, and when it crosses over "0" from negative to positive conversely in a case where the $SiCl_4$ gas is introduced. Therefore, the introduction of the gases into the processing chamber can be detected from the second derivative value of Vpp, and FIG. 7 also illustrates the timing points at which the introductions of the $SF_6$ gas and the $SiCl_4$ gas into the processing chamber are detected.

Figure 8:
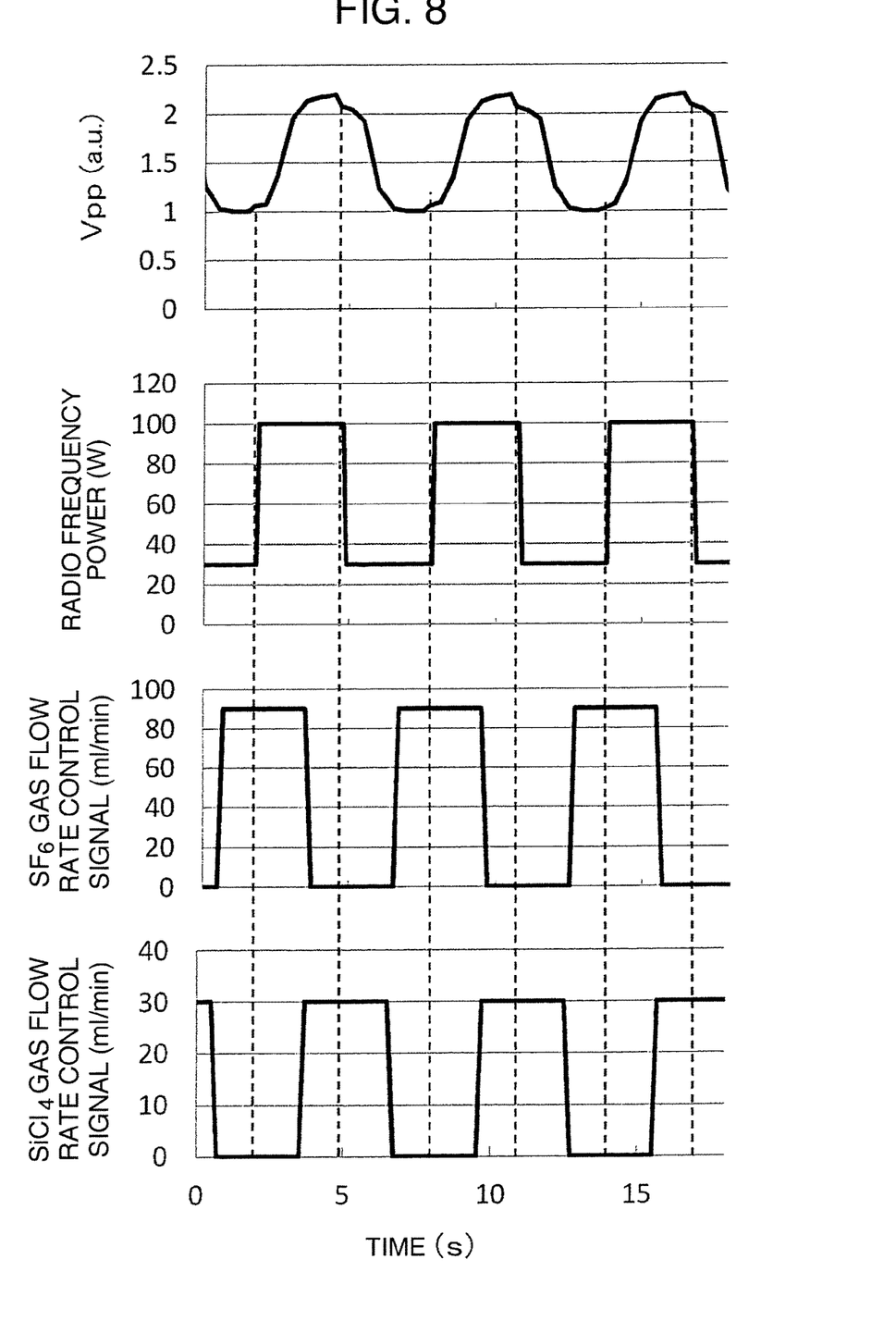
FIG. 8 shows a diagram illustrating changes of Vpp and radio frequency power when the radio frequency power of a radio frequency power supply 113 changes in synchronization by detecting gas introduction using values of the second derivative.

Next, FIG. 8 shows the changes of Vpp and the radio frequency power in a case where the gas introduction is detected from a time when the second derivative value crosses over "0" and the radio frequency power of the radio frequency power supply 113 is changed in synchronization with it. The radio frequency power when the etching gas is introduced is set to 100 W, and the radio frequency power when the deposition gas is introduced is set to 30 W; the other conditions of the etching processing are the same as those of the measurement of FIG. 7. Even in either case of the $SF_6$ gas or the $SiCl_4$ gas, the radio frequency power of the radio frequency power supply 113 changes according to the process conditions of each gas with a delay of about 1 second after change of the control signal for the start of the supply, and the etching processing and the protective film forming processing are performed while an appropriate radio frequency powers are supplied to the etching processing and the protective film forming processing, respectively.

In the present embodiment, the description has been made with the first process gas being the etching gas and the second process gas being the deposition gas, but the present invention is not limited only to a combination of these two. It may also be applied to the etching processing by repeating processings with sequential switching while producing discharge of two or more process gases.

In addition, as an example of a processing the present invention can be applied to other than the etching or the protective film formation, there is a protective film removal processing in which a side surface of a protective film that is formed in the protective film forming step is retained while the bottom surface is removed when proceeding from a protective film forming step to an etching step. Also, there is a processing in which a plasma is generated between processings with a gas difficult to react with a semiconductor substrate, such as the Ar gas, to exhaust from the inside of the processing chamber a gas not preferable to be retained when other processings are performed, so that a gas used in the etching or a gas used in the protective film formation will not remain in the processing chamber when other processings are performed. By further repeating these in combination, a processing of enhanced shape controllability can be performed.

In addition, by combining etching of the gas chopping method to which the present invention is applied and etching not performed repeatedly, an overall etching processing of a semiconductor substrate may be performed. For example, it is possible to perform an over etching in which the gas chopping method of the present invention is not applied after a main etching in which a desired etching depth and shape is obtained by the gas chopping method to which the present invention is applied.

Furthermore, even though the description has been made in the present embodiment with regard to the radio frequency power supplied from the radio frequency power supply 113, the present invention may be applied even to the radio frequency power for generating the plasma.

The control device 115 of the plasma processing apparatus according to the present embodiment periodically transmits the control signals to the plurality of mass flow controllers so as to vary supply amounts of the gases and receives signals of Vpp and the reflected wave from the matching box to detect the timing point at which the gases are introduced to the processing chamber, and then the device performs control of changing the output of the radio frequency power supply. By determining the timing point to change the radio frequency power based on the change of the plasma impedance, it is possible to supply the radio frequency power respectively suitable for the etching processing and the protective film forming processing in synchronization with the gas introduction with high accuracy, and the plasma etching processing having a high shape controllability can be realized.

Further, the present invention is not limited to the above-mentioned embodiments, but various modifications can be included. For example, the present invention can also be applied to what uses a radio frequency power supply for a plasma generating apparatus such as an inductively coupled plasma (ICP) processing apparatus and a capacitively coupled plasma (CCP) processing apparatus, or for applying a bias and uses a matching box to efficiently transmit radio frequency power to a plasma.

In addition, even though the above-mentioned embodiments have been described in detail to help with understanding of the invention, the present invention is not limited to configurations which comprise all the constructions, and various modifications can be made within a scope not departing from the spirit of the invention.

The invention claimed is:

1. A plasma processing apparatus comprising:
a processing chamber configured to perform plasma processing on a sample;
a first radio frequency power supply configured to supply a first radio frequency power to generate a plasma in the processing chamber via a first impedance matching box;
a sample stage configured to place the sample thereon;
a second radio frequency power supply configured to supply a second radio frequency power to the sample stage via a second impedance matching box;
a mass flow controller configured to supply a gas into the processing chamber; and
a control device configured to control the first radio frequency power supply to change the first radio frequency power from a value defined in a first set of process parameters to a value defined in a second set of process parameters based on a change of plasma impedance induced when switching from a first gas defined in the first set of process parameters to a second gas defined in the second set of process parameters, after switching a signal transmitted to the mass flow controller from a signal associated with the first gas to a signal associated with the second gas;
wherein said first and second impedance matching boxes each comprise a voltage sensor,
wherein the change of the plasma impedance is detected based on a value of a first or second derivative of a change in a measured peak-to-peak voltage, and
wherein the change of the first radio frequency power from the value defined in the first set of process parameters to the value defined in the second set of process parameters is determined based on said value of said first derivative of the change in the measured peak-to-peak voltage becoming equal to or greater than a non-zero threshold, or based on said value of said second derivative of said change in said measured peak-to-peak voltage crossing over a zero threshold.

2. The plasma processing apparatus according to claim 1, wherein the change in the measured peak-to-peak voltage is for the second radio frequency power measured by the voltage sensor of the second impedance matching box.

3. The plasma processing apparatus according to claim 1, wherein the change in the measured peak-to-peak voltage is for the first radio frequency power measured by the voltage sensor of the first impedance matching box.

4. The plasma processing apparatus according to claim 1, wherein the control device is configured to control the first radio frequency power supply to change the first radio frequency power from the value defined in the first set of process parameters to the value defined in the second set of process parameters after switching from the first gas defined in the first set of process parameters to the second gas defined in the second set of process parameters.

5. A plasma processing apparatus comprising:
a processing chamber configured to perform plasma processing on a sample;
a first radio frequency power supply configured to supply a first radio frequency power to generate a plasma in the processing chamber via a first impedance matching box;
a sample stage configured to place the sample thereon;
a second radio frequency power supply configured to supply a second radio frequency power to the sample stage via a second impedance matching box;
a mass flow controller configured to supply a gas into the processing chamber; and
a control device configured to control the second radio frequency power supply to change the second radio frequency power from a value defined in a first set of process parameters to a value defined in a second set of process parameters based on a change of plasma impedance induced when switching from a first gas defined in the first set of process parameters to a second gas defined in the second set of process parameters in the processing chamber, after switching a signal transmitted to the mass flow controller from a signal associated with the first gas to a signal associated with the second gas, wherein said first and second impedance matching boxes each comprise a voltage sensor, wherein the change of the plasma impedance is detected based on a value of a first or second derivative of a change in a measured peak-to-peak voltage, and wherein the change of the second radio frequency power from the value defined in the first set of process parameters to the value defined in the second set of process parameters is determined based on said value of said first derivative of the change in the measured peak-to-peak voltage becoming equal to or greater than a non-zero threshold, or based on said value of said second derivative of said change in said measured peak-to-peak voltage crossing over a zero threshold.

6. The plasma processing apparatus according to claim 5, wherein the change in the measured peak-to-peak voltage is for the second radio frequency power measured by the voltage sensor of the second impedance matching box.

* * * * *